United States Patent
Quinn et al.

(10) Patent No.: US 10,871,510 B2
(45) Date of Patent: Dec. 22, 2020

(54) ENERGY DEMAND CHARGE OFFSET SYSTEM

(71) Applicant: WHY ENERGY, LLC, Tucson, AZ (US)

(72) Inventors: Derek R. Quinn, Laguna Niguel, CA (US); Michael J. Naifeh, Tucson, AZ (US); Arthur A. Andrew, Newport Beach, CA (US)

(73) Assignee: WHY ENERGY, LLC, Tucson, AZ (US)

( * ) Notice: Subject to any disclaimer, the term of this patent is extended or adjusted under 35 U.S.C. 154(b) by 0 days.

(21) Appl. No.: 16/119,867

(22) Filed: Aug. 31, 2018

(65) Prior Publication Data
US 2019/0033353 A1    Jan. 31, 2019

Related U.S. Application Data

(63) Continuation-in-part of application No. 15/461,264, filed on Mar. 16, 2017.

(60) Provisional application No. 62/605,845, filed on Aug. 31, 2017, provisional application No. 62/390,024, filed on Mar. 16, 2016.

(51) Int. Cl.
*G01R 21/00* (2006.01)
*H02J 13/00* (2006.01)
*H02J 3/32* (2006.01)
*G06Q 50/06* (2012.01)
*G06F 1/14* (2006.01)

(52) U.S. Cl.
CPC .......... *G01R 21/008* (2013.01); *G06Q 50/06* (2013.01); *H02J 3/32* (2013.01); *H02J 13/0079* (2013.01); *G06F 1/14* (2013.01)

(58) Field of Classification Search
CPC ...... G01R 21/008; H02J 3/32; H02J 13/0079; G06Q 50/06; G06F 1/14
See application file for complete search history.

(56) References Cited

U.S. PATENT DOCUMENTS

| | | | |
|---|---|---|---|
| 2016/0118795 A1* | 4/2016 | Berkowitz | H02J 3/1807 700/286 |
| 2016/0285267 A1* | 9/2016 | Stone | H02J 3/32 |
| 2018/0219374 A1* | 8/2018 | Pavlak | H02J 3/00 |
| 2019/0013662 A1* | 1/2019 | Norrga | H02H 3/08 |
| 2019/0036330 A1* | 1/2019 | Becker | H02H 9/04 |

* cited by examiner

*Primary Examiner* — Thomas C Lee
*Assistant Examiner* — Anzuman Sharmin
(74) *Attorney, Agent, or Firm* — Quarles & Brady LLP

(57) ABSTRACT

A system and method for offsetting peak demand for a customer of an electrical utility is disclosed. The system includes a source of stored electrical energy connected between an electrical service panel and a load. Demand spikes are detected by monitoring current flowing to the load, and when a demand spike is detected, the source of stored energy is connected to the load.

11 Claims, 4 Drawing Sheets

ENERGY DEMAND CHARGE OFFSET SYSTEM

CROSS-REFERENCE TO RELATED APPLICATIONS

The present application claims benefit of and priority from U.S. Provisional Application No. 62/605,845 filed on Aug. 31, 2017 and titled "Demand Charge Offset System", and is a continuation-in-part of U.S. patent application Ser. No. 15/461,264 (published as 2017/0271915A1), filed on Mar. 16, 2017 entitled "Energy Demand Monitoring System and Smart Micro-Grid Controller", which claims priority from U.S. Provisional Application No. 62/390,024, filed on Mar. 16, 2016. The disclosures of all of the above-mentioned Provisional and Non-Provisional patent applications, as well as U.S. Patent Publication No. 2017/0271915A1 are incorporated herein by reference in their entirety.

TECHNICAL FIELD

The present invention relates to electrical energy monitoring, storage and supply devices and systems and, more particularly, to systems and methods for collecting and analyzing electrical power use data at the branch circuit level, i.e., downstream from a meter or grid connection, detecting a demand spike, and then autonomously offsetting the increased demand by supplying power locally.

BACKGROUND

Typically, electrical utilities apply a non-linear rate structure to electricity users. This means that, typically, incremental increases in electricity demand are met with incremental increases in per watt hour charges. Additionally, electric utilities often apply peak demand surcharges for any power (i.e., rate of energy delivery) over specific thresholds, or which is delivered certain peak demand times. The conventional response to these sorts of peak demand rate structures has been demand shedding, i.e., if a customer believes that it is nearing a surcharge threshold or other high charge condition, it reduces its usage, for example, by turning off non-essential pieces of equipment, or by bringing online micro-grid generation resources, such as generators.

The difficulty faced by existing utility customers is access to actionable, real time data about demand increases, which would enable demand shedding or auxiliary power resources to be brought online in time to prevent additional load on the utility connection. While the utilities obviously measure power consumption at the grid connection, they do not effectively report this data to customers in real time. Instead, when reporting peak-demand charges, the utility company will typically provide a month-long set of data measurements at 15-minute intervals. Even with newer smart meters, customers do not receive information about real-time demand. This makes avoiding peak-demand conditions difficult because demand spikes by loads such as HVACs, refrigeration systems, timed lighting, and other high-demand appliances can place instantaneous demand on the utility connection, which lasts only a short amount of time. These "appliance" peak demands take less than one minute and frequently, less than 10 seconds. So while these events will be subject to high peak demand charges from the utility, they typically occur too quickly for the customer to address, even if the customer has access to smart meter data. Additionally, existing microgrid power sources such as generators are sometimes too slow to meet the increase demand before power is pulled through the utility connection and a peak demand charge is incurred.

SUMMARY OF THE INVENTION

Embodiments of the invention are directed to a system for detecting spikes in electricity demand, and then autonomously offsetting that demand with locally stored power so that a user of the system does not incur high power demand charges from the utility. Embodiments of the invention include one more electric use monitors having an analog front end that receives as input the output of a current transformer connected to a load. The analog front end converts analog input data reflecting the monitored current to a digital value. A micro controller that is electrically connected to the analog front end receives the digital value from the analog front end and pushes the digital value(s) to an offset system directly with data based analysis on the cloud server or to a cloud server which supplies activation data from the analysis. In certain embodiments, the use monitor includes an SD card, or some other form of local storage, which stores the digital value received from the micro controller. The monitor generally includes a power supply, including an optional battery backup, and one or communications interfaces such as Ethernet, WiFi, I2C or the like.

Embodiments of the invention also include local or remote processing facilities which receive the real time current measurements and use that data to detect and/or predict demand spikes. In certain embodiments, this processing includes calculating instantaneous power demand, and comparing the instantaneous power demand to one or more preset thresholds. In other embodiments, the processing includes calculating the rate of change of power demand, and comparing the rate of change of power demand to predetermined thresholds. Alternatively or additionally, future power demand is calculated on the basis of the computed rate of change of power demand, and the future power demand prediction is compared to predetermined thresholds. In some embodiments, the predetermined thresholds are set on the basis of peak demand rate schedules set by a connected utility. In certain embodiments, the processing facility is located off-site, as a cloud computing resource. In other embodiments, the processing facility is a computer that is local to the utility customer, or is a microprocessor located in proximity to the other components of the demand offset system.

When one or more of the threshold conditions discussed above are met, one or more control signals are sent from the processing facility to a local controller, which is electrically interposed between a connected customer's service panel and an electrical load (e.g., a branch circuit or individual appliance). In response to the control signals, or as a result of its own local calculations, the local controller selectably connects (via a solid state or electromechanical switch) a source of power to a load. This results in a decrease in demand, which prevents utility peak demand charges. In certain embodiments, the power source is an ultra or super capacitor, which has the advantage of being able to store a sufficient quantity of energy and deliver it sufficiently quickly to prevent the utility from seeing a demand spike. In certain embodiments, the local controller includes inverters to permit charging of the energy source, and electrically interfacing with the appliance or other load.

Embodiments of the invention have certain advantages. According to embodiments of the invention, by sensing and reacting to demand spike in real time, the invention enables utility customers to avoid peak demand charges.

BRIEF DESCRIPTION OF THE DRAWINGS

The invention will be more fully understood by referring to the following Detailed Description in conjunction with the Drawings, of which.

DETAILED DESCRIPTION

Figure 1:
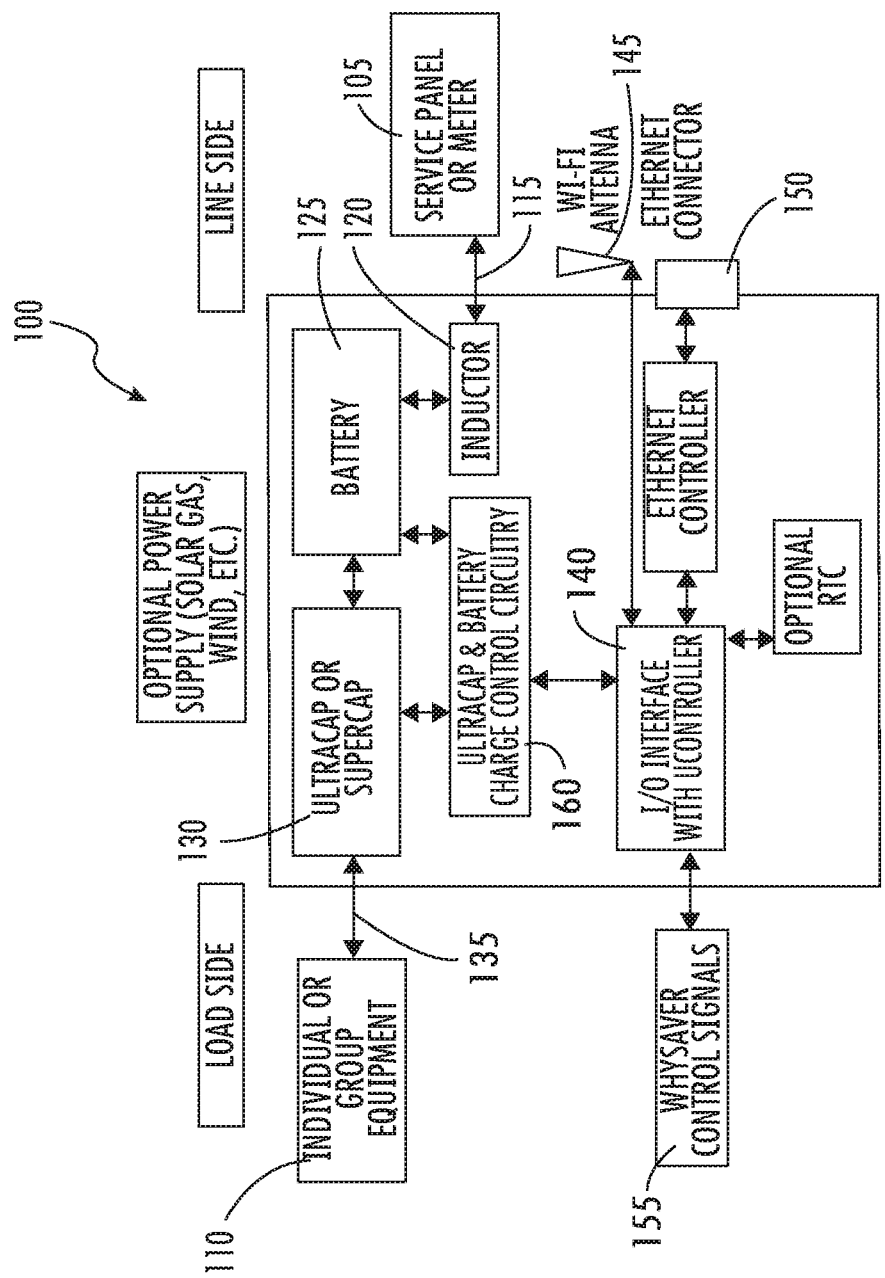
FIGS. 1-3 are system block diagrams of the components of peak demand offset system for supplying local power to a load, in accordance with the invention.

Referring now to FIG. 1, there is shown an internal peak-demand offset system 100 according to an inventive embodiment. The controller of FIG. 1 is electrically interposed between an electrical utility connection and a load, for example, by being connected between a service panel or meter 105 and a piece of equipment 110. Offset systems may be associated with an entire electrical customer's connection, individual branch circuits, collections of load equipment (e.g., groups of refrigeration units, HVACs or banks of lights), or individual pieces of equipment. System 100 includes power input 115, which receives supply power from the utility connection. This supply power is passed through system 100 to power output 135, where it is then supplied to load 110. Interconnected between power input 115 and output 135 is an input inductor 120, a battery 125 and a capacitor 130. Input power, after it passes through inductor 120, is used to charge battery 125. Battery 125 has an output connected to Ultra or Super Capacitor 130. Battery 125 and capacitor 130 are selectably connected to system power output 135 and thence to load 110 via non-illustrated solid state or electromechanical switches. In normal operation, system 100 passes through power from input 115, through inductor 120, and then to output 135 and to load 110.

Upon detection of a demand spike, which will be described further below, capacitor 130 and optionally, battery 125 are connected to load 110 via output 135. Capacitor 130 has sufficient capacitance to supply between 60 kW and 120 kW to an attached load for up to five minutes. Battery 125 serves to sustain the capacitor somewhat during its discharge period, and keeps capacitor 130 topped off during intermittent failure or interruption of input power. The combination of battery 125 and capacitor 130 together, in addition to meeting increase power demands during normal utility operation, are also connectable to the load 110 in the event of a temporary utility power-down condition to supply backup power.

Inductor 120 has a relatively small inductance, preferably in the range of 5 to 10 micro-Henries. Inductor 120 serves as a choke on the rate of change of input power (i.e., current). When load 110 increases and draws additional current through system 100 from the utility (i.e., through service panel 105), inductor 120 slows down the rate current increase so that battery 125 and capacitor 130 can be connected to load 110 to service the increased demand before the utility can detect the demand spike.

System 100 also includes input/output interface and microcontroller 140 and an optional real time clock (RTC). I/O interface and microcontroller 140 receive and send data to external devices through one or more data I/O ports, for example, a WiFi radio 145 and/or Ethernet port 150. Preferably, microcontroller receives control signals from an external current monitor and analysis device 155, which is connected to monitor current being supplied from the connection to the utility 105 and the load 110. Acceptable current monitoring and analysis devices are described in co-pending parent application Ser. No. 15/461,264 (published as 2017/0271915A1) in connection with, at least, FIGS. 1, 13, 2 and 4. These devices monitor current where installed and pass time-varying current information to a cloud-based processing facility for analysis.

In accordance with the present invention, a cloud based external processing facility (e.g., an offsite server, or collection of servers executing computer executable instructions stored on non-transitory, electronically connected storage) receives real-time current measurements of the current on the connection between load 110 and service panel 105. Preferably, current is measured at a frequency that exceeds the utility AC input frequency (i.e., exceeds 60 Hz). Instantaneous current measurements are processed in the external processing facility and are stored. Current rate of change as a function of time is calculated. Either or both of these quantities are compared with stored, pre-determined thresholds to determine whether a demand spike is occurring. These thresholds may be determined on the basis of peak demand rate schedules from the utility, which will be typically be a function of demand (i.e., power level thresholds). The thresholds may also be a function of time, for example, where the utility charges more at a given power level during the day than at night. In the event that a threshold exceeded, the external processing facility sends a control signal to system 100. In response to the control signal, the microprocessor connects capacitor 130 and/or battery 125 to load 110 via capacitor and battery control and charging circuitry 160. Capacitor and/or battery 130, 125, then supply additional current to load 110, which mitigates the demand spike, thereby avoiding peak demand charges.

In alternative embodiments, control signals are sent in response to a prediction of a future power demand, on the basis of current trends, including instantaneous current or power rate-of-change, or by comparing contemporaneously measured demand patterns with historically measured and stored demand patterns.

In certain embodiments, current sensors communicate current data directly to demand offset system 100, which uses an on board processor (e.g., microprocessor 140) to compare received current values, compute the current rate of change, and compare these quantities, on an ongoing basis, to stored thresholds. In this case, system 100 includes on-board non-illustrated non-transitory storage.

In order to successfully offset the peaks caused by spurious demands as load equipment activates, while slowing down the spike in current being drawn from the utility, it is preferable for system 100 to receive and act on control signals within two 60 Hz cycles, and ideally, predictively in one-quarter of a 60 Hz cycle. Systems according to the invention collect and analyze data on the rate of change of demand as equipment activates and from that information, determine intelligent ways to offset the demand. In other words, where conventional demand offset are always activated, systems according to the invention provide the ability to determine when and where to apply the amount of spurious demand for a given piece of equipment as well as determine if that equipment is functioning normally or if it needs service or replacement.

While in the preferred embodiment, system 100 relies on a capacitor and battery charged from line power to supply demand mitigating power, in alternative embodiments, other auxiliary power sources such as solar, wind or gas generators are available as power sources that may be connected to load 110 in the event of a demand spike.

Figure 2:
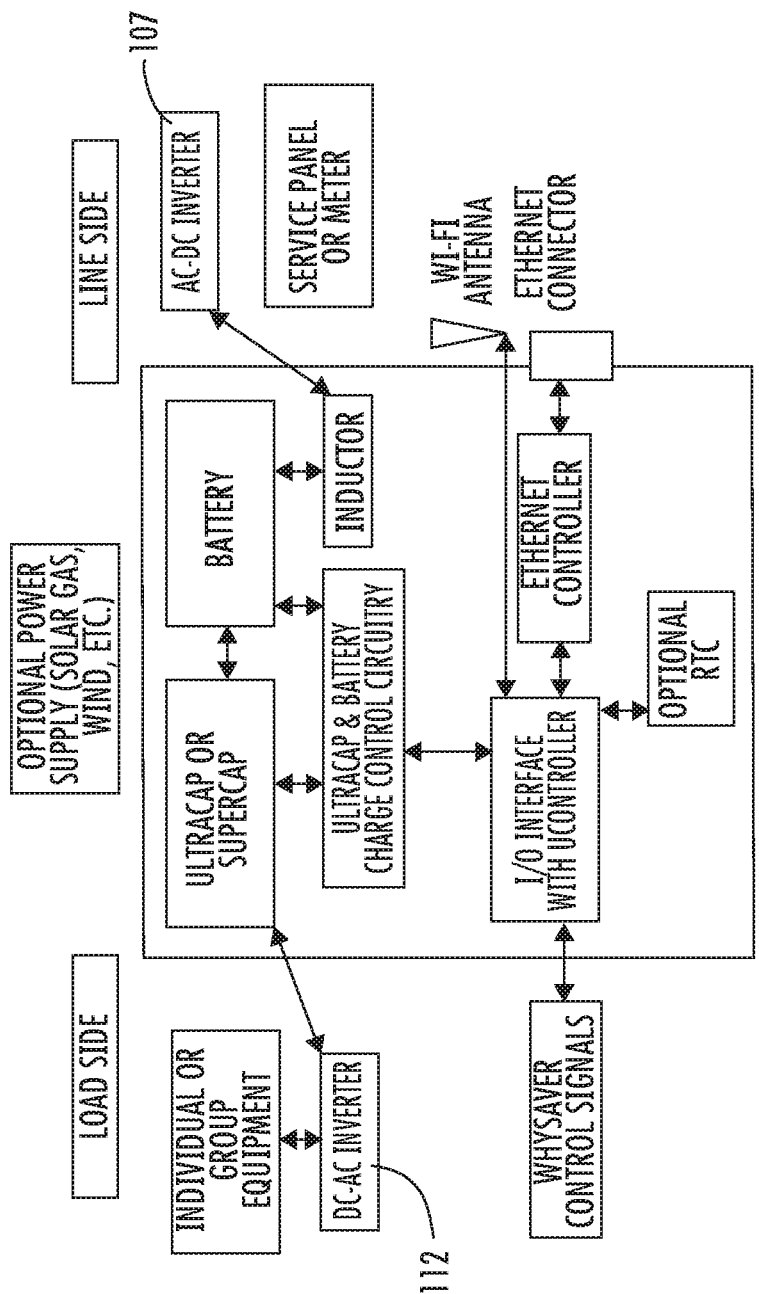
Figure 3:
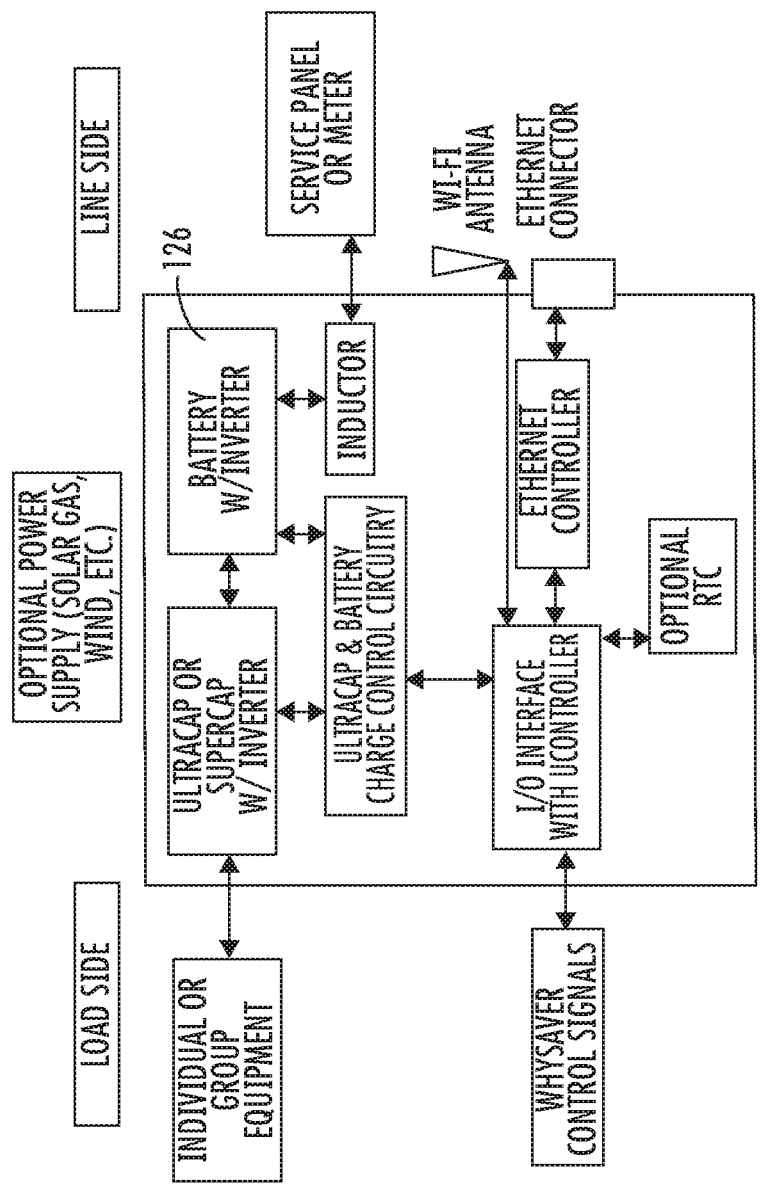

FIGS. 2 and 3 illustrate alternative embodiments of the system of FIG. 1. In the embodiment of FIG. 2, input and output inverters 107,112 are included to supply DC power to system 100 and AC power to equipment 110. In the embodiment of FIG. 3, AC is passed through system 100, but an inverter is included with battery 126 to supply DC voltage to charge the battery.

Figure 4:
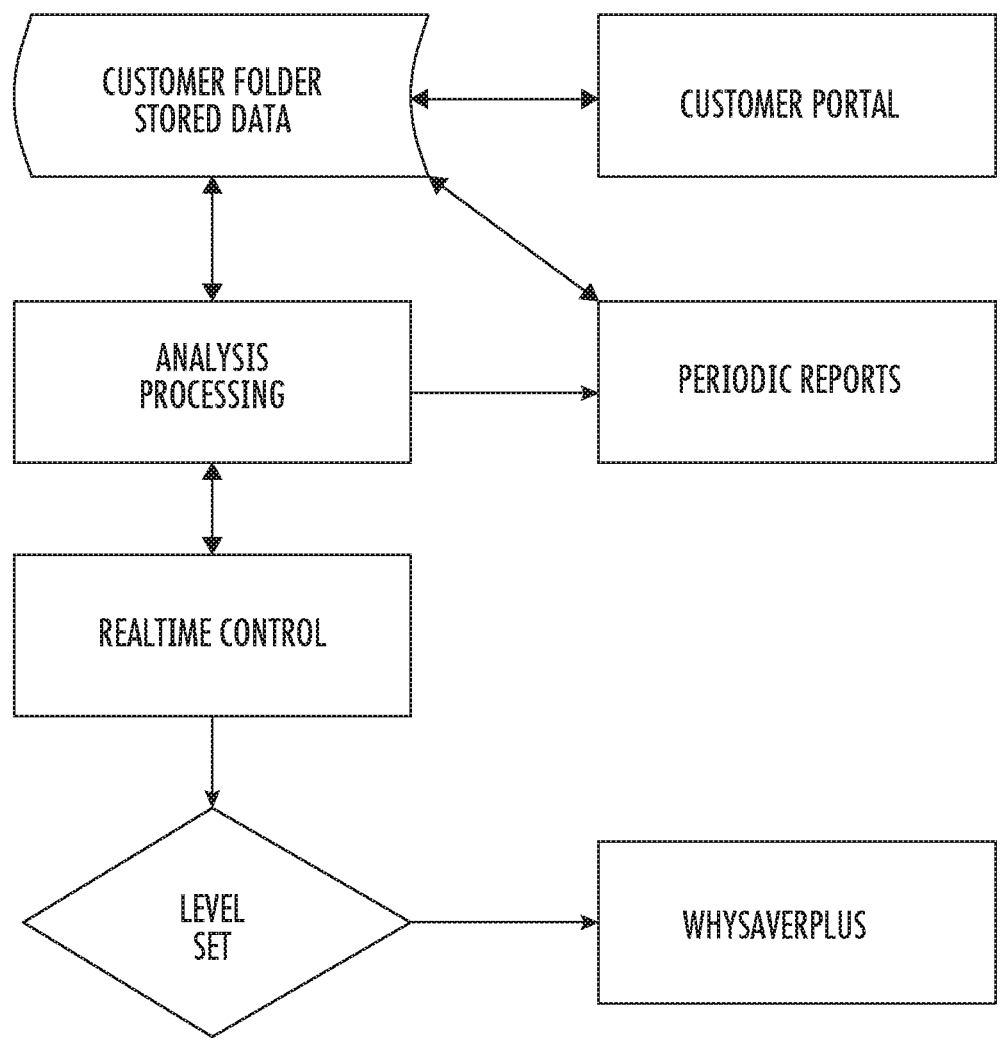
FIG. 4 is a flow diagram depicting information and control flows according to an inventive embodiment.

FIG. 4 illustrates information flow between the current monitors and analysis systems described in parent application Ser. No. 15/461,264 (published as 2017/0271915A1 and the demand offset system of the instant invention. As is set forth above, a processing facility, i.e., a server or cloud computing application is in communication with one or more current monitors distributed at a utility customer, preferably on internal branch circuits or individual pieces of equipment that are connected to the customers utility panel. Processing facility is also connected to non-transitory storage containing data encoded as computer readable instructions. The data relate to customer files, which contain, for example, information regarding historical power demand and the threshold data discussed above. Processing facility also communicates information to the customer via a customer portal, which in certain environment is a web based application that the customer can use to manage the thresholds and receive historical data about power use. The processing facility analyzes and processes received current data, for example, by comparing it to predetermined thresholds or by predicting future power use by comparing contemporaneously measured use patterns to historical ones. Period reports may be issued, for example, though the customer portal, as a result of this analysis. As is described above, the processing facility also sends control signals to the demand offset system under predetermined circumstances, for example, when thresholds are exceeded.

The invention should not be viewed as being limited to the disclosed embodiments. Envisioned claims may be directed to at least a system and/or method for fabrication of an energy demand monitoring and control system, an article of manufacture produced with the use in such system and/or method, and a computer program product for use with a system and/or method of an embodiment of the invention. Indeed, while the preferred embodiments of the present invention have been illustrated in detail, it should be apparent that other modifications and adaptations to those embodiments might occur to one skilled in the art without departing from the scope of the present invention.

The invention claimed is:

1. An electrical peak demand offset system, connected between a service panel and an electrical load, the system comprising:
   a switch;
   a source of stored electrical energy selectably connectable to the electrical load by the switch;
   a pass-though electrical path between the service panel and the load, the pass-through electrical path including an inductor arranged prior to a connection to the load, the inductor having an inductance value sufficient to slow down a rate of current increase to the load such that the source of stored electrical energy may be connected to the load by the switch before a current increase can be detected by a connected electrical utility;
   a power input electrically connected to the service panel;
   a power output electrically connected to the load;
   a microprocessor connected to the switch by a data communications path;
   a communications interface connected to the microprocessor by a data communications path.

2. The system of claim 1, wherein the source of stored electrical energy comprises a battery or a capacitor.

3. A method of offsetting peak electrical demand by an electrical utility customer, the method comprising:
   measuring current on an electrical connection between a load and an electrical utility; computing, on the basis of the current measurements, the electrical demand of the load;
   comparing the computed electrical demand to stored thresholds;
   on the basis of the comparison, connecting a source of stored electrical energy to the load, the method further comprising the step of limiting the rate of current increase on the connection between the load and the electrical utility by providing an inductor on a connection between the electrical utility and the load, wherein, the inductor sufficiently limits the rate of current increase to allow for connection of the source of stored electrical energy to the load before the electric utility can detect a demand spike.

4. The method of claim 3, wherein measuring current on the electrical connection between the load and the electrical utility comprises sampling current at a rate that exceeds 60 Hz.

5. The method of claim 3, further comprising determining the stored thresholds on the basis of data regarding demand charges by the electric utility.

6. The method of claim 5, wherein the stored thresholds are a function of time of day.

7. The method of claim 3, wherein computing the electrical demand of the load comprises computing the time-varying current being drawn by the load.

8. The method of claim 3, wherein computing the electrical demand of the load comprises predicting a future electrical demand on the basis of currently observed current measurements.

9. The method of claim 3, wherein connecting the source of stored electrical energy to the load comprises, connecting a capacitor to the load.

10. The method of claim 9, further including charging the capacitor via a connection to the electrical utility.

11. The method of claim 3, including supplying supplemental power to the load before a demand spike can be detected by the connected utility.

* * * * *